(12) United States Patent
Atkinson et al.

(10) Patent No.: US 6,680,849 B2
(45) Date of Patent: Jan. 20, 2004

(54) EXTRUDED HEATSINK AND EMC ENCLOSURE

(75) Inventors: John C. Atkinson, Ottawa (CA); Simon E. Shearman, Almonte (CA)

(73) Assignee: Nortel Networks Corporation, St. Laurent (CA)

(*) Notice: Subject to any disclaimer, the term of this patent is extended or adjusted under 35 U.S.C. 154(b) by 0 days.

(21) Appl. No.: 10/113,802

(22) Filed: Mar. 29, 2002

(65) Prior Publication Data
US 2003/0184974 A1 Oct. 2, 2003

(51) Int. Cl.⁷ .............................. H05K 7/20; H05K 9/00
(52) U.S. Cl. .................. 361/719; 174/252; 174/35 R; 165/80.3; 165/185; 361/690; 361/707; 361/715; 361/818; 361/756; 361/758
(58) Field of Search .................. 165/80.2, 80.3, 165/80.4, 185; 174/16.3, 252, 50.5, 50.51, 50.54, 35 R, 35 GC; 361/606, 679, 688–690, 703–704, 707, 709–710, 715, 756, 758, 802, 804, 816, 818

(56) References Cited

U.S. PATENT DOCUMENTS

| | | | | | |
|---|---|---|---|---|---|
| 4,471,898 A | * | 9/1984 | Parker | .................. | 361/679 |
| 4,656,559 A | * | 4/1987 | Fathi | .................. | 361/690 |
| 4,710,853 A | * | 12/1987 | Reinhardt | .................. | 361/600 |
| 4,716,498 A | * | 12/1987 | Ellis | .................. | 361/715 |
| 5,109,318 A | * | 4/1992 | Funari et al. | .................. | 361/688 |
| 5,309,315 A | * | 5/1994 | Neadel et al. | .................. | 361/704 |
| 5,461,542 A | * | 10/1995 | Kosak et al. | .................. | 361/710 |
| 5,999,406 A | * | 12/1999 | McKainm et al. | .................. | 361/704 |
| 6,108,194 A | * | 8/2000 | Seligman et al. | .................. | 361/600 |
| 6,535,409 B2 | * | 3/2003 | Karol | .................. | 361/715 |

* cited by examiner

Primary Examiner—Gregory Thompson
(74) Attorney, Agent, or Firm—Fish & Richardson P.C.

(57) ABSTRACT

An enclosed electronic component is provided by extruding first and second heatsink members having a plurality of cooling structures disposed on first surfaces thereof and an electronic component board between the first and second heatsinks, with a pair of joining members and conductive gaskets to form an electromagnetically sealed enclosure and a thermal pathway to remove heat from the electronic component.

21 Claims, 8 Drawing Sheets

EXTRUDED HEATSINK AND EMC ENCLOSURE

BACKGROUND

This invention relates to packaging of electronic and optical components.

Modern electronic components have design goals that are conflicting. Generally electronic components emit electromagnetic (EM) radiation and such EM radiation often interferes with the performance of other components. Often in-order to assemble electronic components into a system some of the components are shielded from stray EM radiation. Typically such shielding is provided by a conductive enclosure.

Another design goal relates to the heat produced by electronic components. Often such heat must be removed from the component to avoid excessively high temperatures that can damage or interfere with the component or its operation. Cooling can use a fan to move cooling air past the component to carry off the excess heat. Often heatsink structures are used with or without fans to aid in the conduction of the heat from the electronic components.

In many instances the enclosure that provides adequate EM shielding leads to difficulties in removing heat efficiently from the component. A solution to this conflict is to die cast an enclosure, for an electronic component, which provides both the EM compatibility (EMC) and the thermal coupling to the electronic component.

SUMMARY

In general, in one aspect the invention features a method for producing an enclosed electronic component. The method includes: extruding a first heatsink member having a plurality of cooling structures disposed on a first surface; extruding a second heatsink member having a plurality of cooling structures disposed on a first surface; disposing an electronic component board on a second surface of one of the first and second heatsink members; and joining the first and second heatsink members, with a pair of joining members to form a sealed enclosure for the electronic component board with the sealed enclosure providing electromagnetic isolation of the electronic component and a thermal pathway to remove heat from the electronic component.

Embodiments of the method may include any one of the following features.

The extruding the first and second heatsink may further include: forming first ribs on the second surfaces of the first and second heatsinks, with the electronic component board having conductive bands on top and bottom surfaces thereof that are aligned with portions of the first ribs.

The joining may further include: joining the top and bottom conductive bands of the electronic component board to the first rib of the first and second heatsink members respectively.

The extruding the first and second heatsink may further include: forming second ribs on the second surfaces of, the first and second heatsinks with the electronic component board having a second pair of conductive bands on top and bottom surfaces thereof that are aligned with portions of the second ribs and joining further includes: joining the first and second top conductive bands of the electronic component board to the first and second rib of the first heatsink member and joining the first and second bottom conductive bands of the electronic component board to the first and second rib of the second heatsink member respectively.

The above method may further include forming positioning pins that align the first heatsink member, the second heatsink member, and the electronic component board.

A first portion of the positioning pins may provide vertical positioning and a second portion may provide horizontal positioning of the electronic component board.

The joining may include: securing contacting regions of the first and second heatsinks, the electronic component board, and a pair of joining members with screws, and sealing regions about the contacting regions with conductive gasket material.

The extruding of the top or bottom heatsink may include forming a substantially cylindrical channel in the top or bottom heatsink wherein the diameter of the channel is suitable for forming threads that engage the screws.

The joining may include welding contacting regions of the first heatsink, the second heatsink, the electronic component board and a pair of joining members.

The joining may include securing contacting regions between the first heatsink, the second heatsink, the electronic component board and a pair of joining members by using a combination of screws and sealing regions about the contacting regions with conductive gasket material for some of the contacting regions and welding for other contacting regions.

The electronic component board may further include heat transfer structures that provide thermal coupling between the electronic component and the top or bottom heatsink.

In another aspect, the invention features a method for producing an enclosure for an electronic component. The method includes: extruding a first heatsink member having a plurality of cooling structures disposed on a first surface; extruding a second heatsink member having a plurality of cooling structures disposed on a second surface; joining the first and second heatsink members with a pair of joining members to form a sealed enclosure, the sealed enclosure providing electromagnetic isolation of the electronic component and a thermal pathway to remove heat from the electronic component.

The joining may include: securing contacting regions of the first and second heatsinks, and the pair of joining members with screws and sealing regions about the contacting regions with conductive gasket material.

The extruding of the top or bottom heatsink may include forming a substantially cylindrical channel in the top or bottom heatsink wherein the diameter of the channel is suitable for forming threads that engage the screws.

The joining may include: welding contacting regions of the first and second heatsinks, and the pair of joining members.

The joining may include: securing contacting regions of the first and second heatsink members, and the pair of joining members by using a combination of screws and sealing regions about the contacting regions with conductive gasket material for some contacting regions and welding the contacting regions for other contacting regions.

In another aspect, the invention features a packaged electronic component. The package includes: an extruded first heatsink member having a plurality of cooling structures disposed on a first surface wherein the cooling structures have smooth surfaces characteristic of an extruded part; an extruded second heatsink member having a plurality of cooling structures disposed on a first surface wherein the cooling structures have smooth surfaces characteristic of an extruded part; an electronic component board disposed within an enclosure provided by the first and second heatsink members, and a pair of joining members secured; and wherein the first and second heatsink, the joining members, and the electronic component board are joined at contacting regions to form a sealed enclosure for the electronic component board with the sealed enclosure providing electromagnetic isolation of the electronic component and a thermal pathway to remove heat from the electronic component.

The first and second heatsink may include: a first rib on the second surface of the first and second heatsinks and the electronic component board includes conductive bands on a top and a bottom surface of the electronic board and wherein the top and bottom conductive bands of the electronic component board and the first ribs of the first and second heatsink members sealed with conductive gasket material.

The first and second heatsink may further include: a second rib on the second surface of the first and second heatsinks and the electronic component board includes second conductive bands on the top and the bottom surface of the electronic component board and the second ribs of the first and second heatsink members sealed with conductive gasket material.

The package may further include positioning pins that align the first heatsink member, the second heatsink member, and the electronic component board.

The positioning pins provide either vertical or horizontal positioning of the electronic component board.

The contacting regions may include screws that secure the contacting regions of the first heatsink, the second heatsink, the electronic component board and the pair of joining members and regions of conductive gasket material about the contacting regions.

The top or bottom heatsink may have a substantially cylindrical extruded channel in the top or bottom heatsink wherein the diameter of the channel is suitable for forming threads that engage the screws.

The electronic component board may further include a heat transfer structures that provide thermal coupling between the electronic component and the top or bottom heatsink.

The contacting regions may include welds of the first heatsink, the second heatsink, the electronic component board and a pair of joining members.

The contacting regions of the first heatsink, the second heatsink, the electronic component board and a pair of joining members may include a combination of screws and conductive gaskets for some of the contacting regions and welds for other contacting regions.

One or more aspects of the invention may provide one or more of the following advantages.

The invention provides an enclosure for an electronic component with fine cooling structures. Unlike alloys used for die casting that typically have lower heat conductivities than pure metals the enclosure offers improved conductivity. In addition the fine, high surface area features that provide efficient thermal coupling between the electronic components and the cooling gases are easier to produce. Furthermore, while die-casting is typically relatively expensive and requires a relatively lengthy time from product conception to product manufacture, extrusion is less expensive and has a relatively short time from concept to product.

The details of one or more embodiments of the invention are set forth in the accompanying drawings and the description below. Other features, objects, and advantages of the invention will be apparent from the description and drawings, and from the claims.

DETAILED DESCRIPTION

Extrusion offers a technique of forming parts for EMC and thermal enclosures of electronic components. The alloys used for extrusion typically have electrical and thermal properties that are at least as desirable as alloys used for die-casting. Furthermore, design features on extruded parts can be finer than the features that are efficiently produced by die-casting. In addition, the initially cost of tooling for new extruded parts and the time to market is much lower than the cost of die-casting. (Typical tooling costs for new extruded parts are about $6000 and the time to market is only 4–6 weeks.)

The electronic component enclosures are typically formed from five pieces: an extruded top heatsink, an extruded bottom heat sink, a pair of side pieces, and the electronic component itself. The following will detail these parts, how they are made, and how they are put together to form an enclosure.

Figure 1:
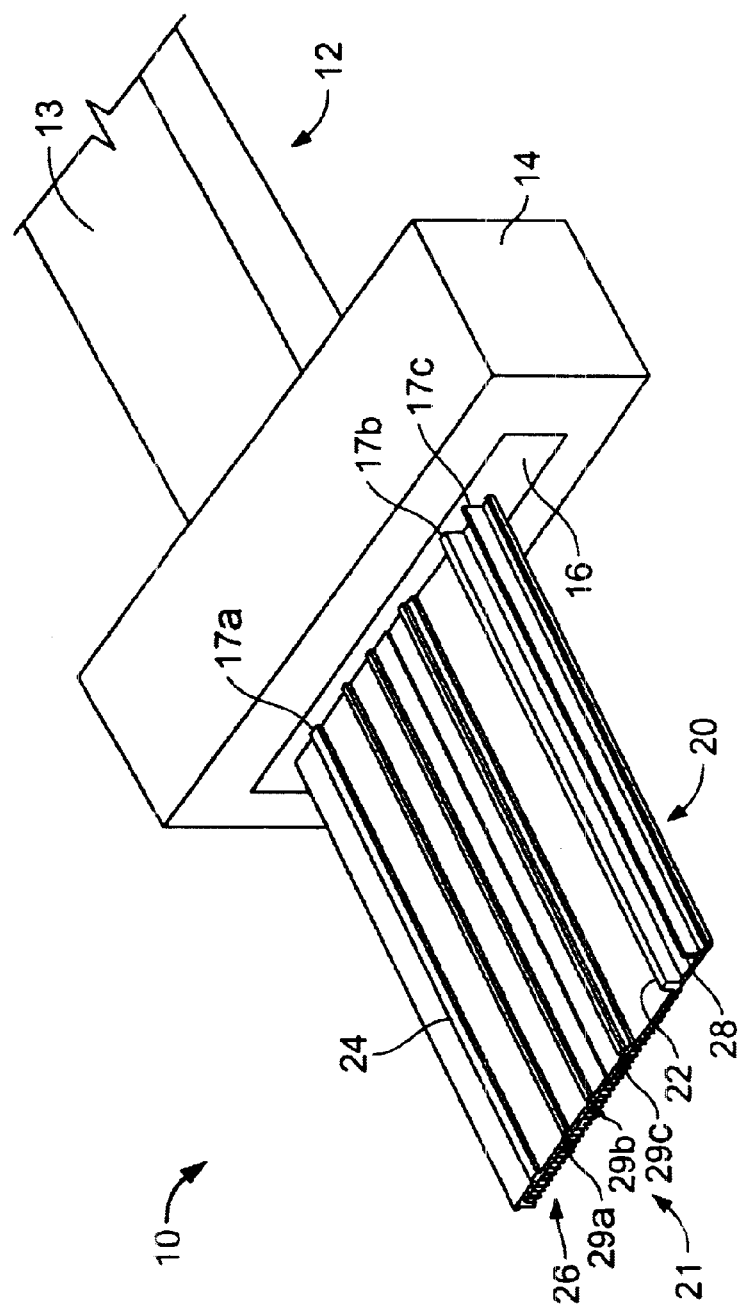
FIG. 1 is a schematic depiction of an extrusion machine extruding a bottom heat sink portion of an EMC enclosure.
Figure 5:
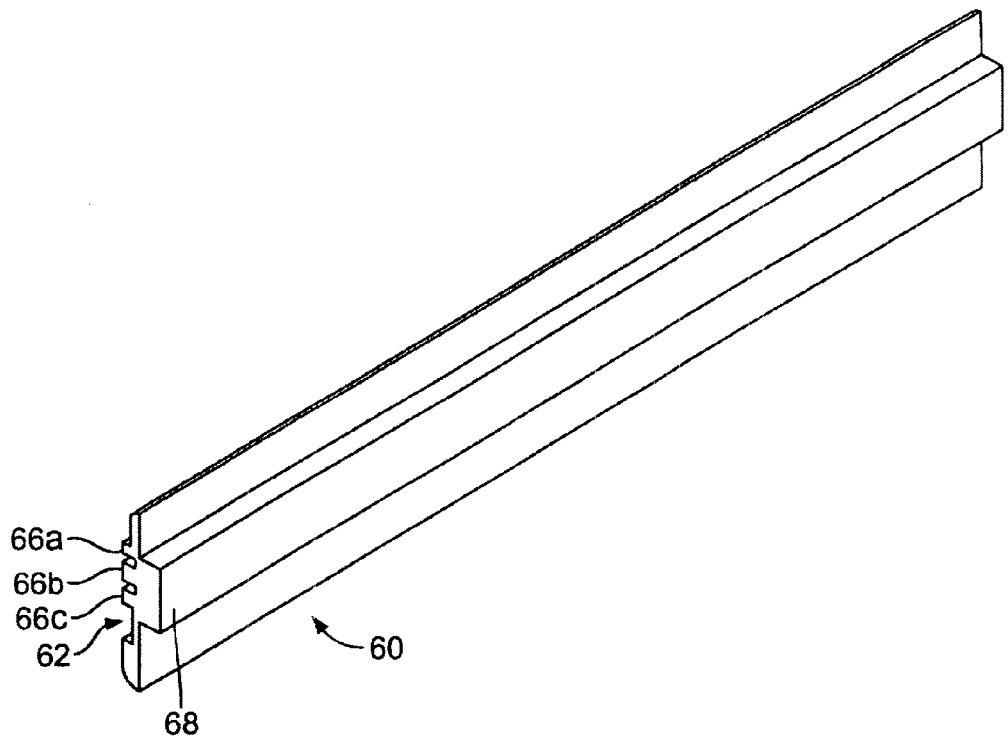
FIG. 5 an isometric plan view of a machined extruded part suitable for use as the sides of enclosure.

Referring to FIG. 1 an extrusion apparatus 10 suitable for forming extruded parts is shown. Molten alloy 13 enters the extrusion machine under pressure along inlet 12 into main chamber 14. The alloy is forced out of main chamber 14 through die 16. The features of die 16 determine the shape of the extruded member. As shown in FIG. 1 the die has features that correspond to a negative of a member that can serve as a bottom heatsink 20. Other dies are used to produce other portions of a package, as depicted in FIG. 5. In general, the cross sectional features of extruded heatsink 20 are formed by the cross sectional features 17a, 17b, and 17c of die 16. Typically die 16 is relatively easy to install and remove from the extrusion apparatus 10. Furthermore, die 16 is relatively inexpensive to manufacture. Thus, the manufacture of new H parts involves manufacture of a new die and installing the new die into the extrusion apparatus. This versatility and relatively low cost compared to die casting allows engineers to readily redesign old parts in order to implement improvements or to readily design new extruded parts customized to a new application. As the alloy is forced into chamber 14, the alloy is forced through the die to form the member, e.g., bottom heat sink member 20. Typically, parts used for EMC enclosures and thermal coupling are extruded from aluminum based alloys such as 6063-T6.

A, Heatsink 20 is cut to length and its edges are milled. Extruded bottom heatsink 20 has multiple cooling structures, for example fin 26, on its surface 21. These fins will provide a thermal coupling mechanism between the interior enclosure and external surroundings. Heatsink 20 has front and back ribs 22 and 24 respectively. Such ribs form part of the front and back seals respectively of the enclosure. Heatsink 20 further includes a latch rib 28 that provides the material that will be machined into part of a latching mechanism. In addition to such features, the heatsink 20 may have features similar to spacers ribs 29a, 29b, and 29c. These ribs provided the raw material on the heatsink for features like board spacers.

Figure 2:
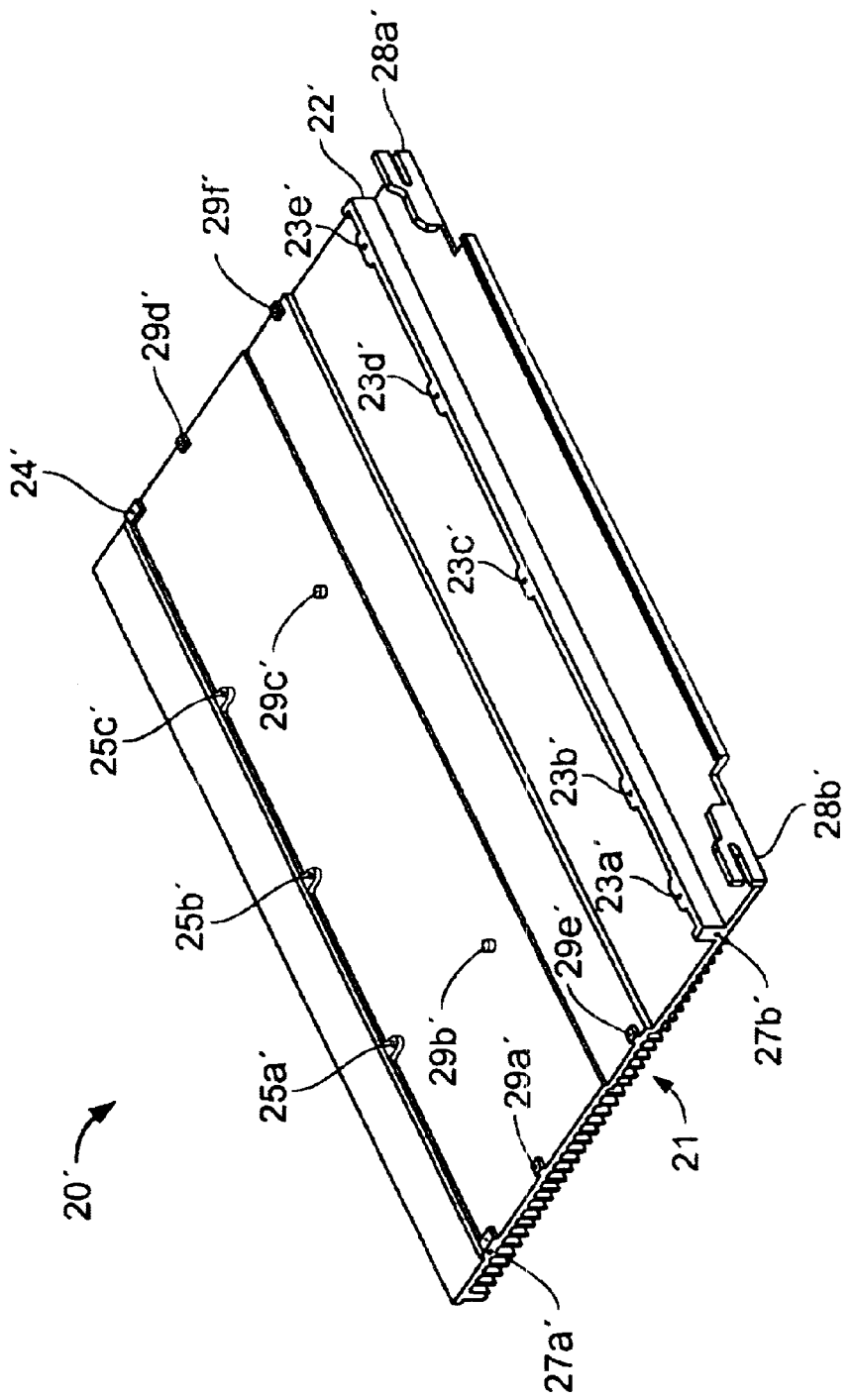
FIG. 2 is an isometric plan view of a finished bottom heatsink formed by machining the part depicted FIG. 1.

Milling machines remove the excess material from extruded bottom heatsink 20 to form the finished bottom heatsink 20' as shown in FIG. 2. Surface features of heatsink 20' that are formed by extrusion, such as the fin 26, have surfaces that are smooth. In contrast, surface features that are formed by machining have surfaces with distinctive machining marks. Furthermore both of these surfaces are contrasted to the surfaces formed by die-casting. Die-casting often results in surfaces that are rougher than extruded surfaces and are porous and pin-holed. Milling is performed to specifications that are tailored to a particular package. Heatsink 20' includes machined front and back ribs 22' and 24' respectively. Machining removes material from ribs 22 and 24 (see FIG. 1) leaving behind islands 23a40 –23e' and 25a'–25c' and back ribs 22' and 24'. These islands include drilled holes, which are tapped to receive threaded screws. As the members 22' and 24' form part of the seal for the enclosure, the islands 23a'–23e' and 25a'–25c' provide space around the holes tapped to receive screws to allow for adequate gasketing material to form a seal. Rib 28 (FIG. 1) is machined to form the completed latching mechanism 28a' and 28b' and ribs 29 (FIG 1) are machined to form spacers 29a'–29f'. The spacers will support the electronic components that will be held inside the enclosure. The spacers provide mechanical support and accurate positioning of the electronic components. Holes 27a' and 27b' are drilled and tapped into the side of heatsink 20'. These tapped holes receive screws that connect the heatsink member 20' with side members of the enclosure.

Figure 3:
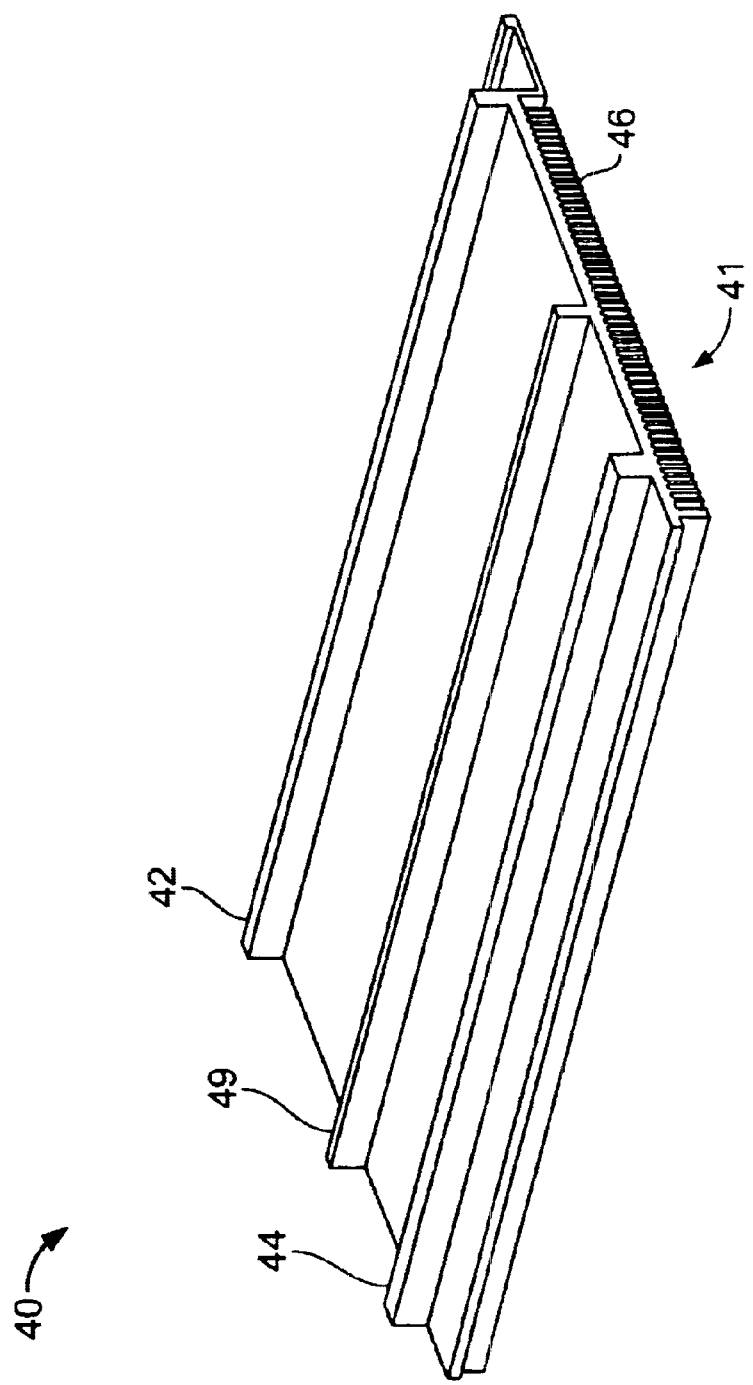
FIG. 3 is an isometric plan view of an extruded part suitable for machining into the top heatsink of an EMC enclosure.
Figure 4:
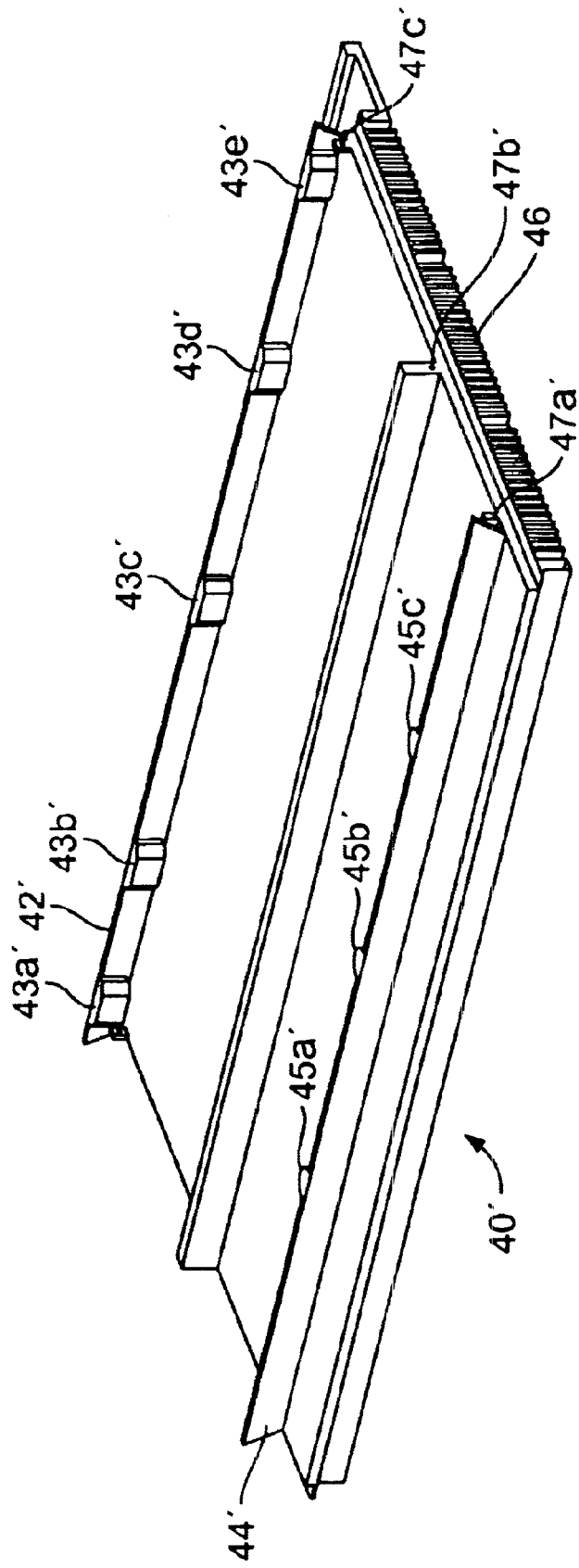
FIG. 4 is an isometric plan view of the finished top heatsink formed by machining the extruded part of FIG. 4.

Using a similar extrusion process as described above a different die produces the extruded top heatsink part 40 shown in FIG. 3. Similar in design to part 20, part 40 includes multiple cooling structures, for example cooling fin 46, on its surface 41. Part 40 further includes front rib 42, back rib 44 and spacer rib 49. Additional processing for example milling, modifies the part to produce the finished top heatsink 40' as shown in FIG. 4. Again, in analogy to part 20', the machining of heatsink 40' modifies ribs 42 and 44 to produce ribs 42' and 44' each of which has islands with screw holes 43a'–43e' and 45a'–45c' respectively. Holes 47a'–47c' are drilled and tapped into the side of part 20' for coupling the top heatsink to the enclosure side members.

Another extrusion process forms extruded side member 60 as shown in FIG. 5. Side member 60 includes chassis guide 62. Side member 60 forms the sides of the enclosure. Chassis guide 62 forms a channel that mates with guides in the chassis, which guide the finished enclosure into the proper position in the chassis. Extruded member 60 further include ribs 66a–66c that provide material for screw locations. In some embodiments, side member 60 can include electronic component positioning guide 68. This structure sits flush on top of the electronic component, and aligns the electronic component with the enclosure. In some embodiments, the side parts can be formed using other manufacturing processing such as die casting or machining raw stock.

Figure 6:
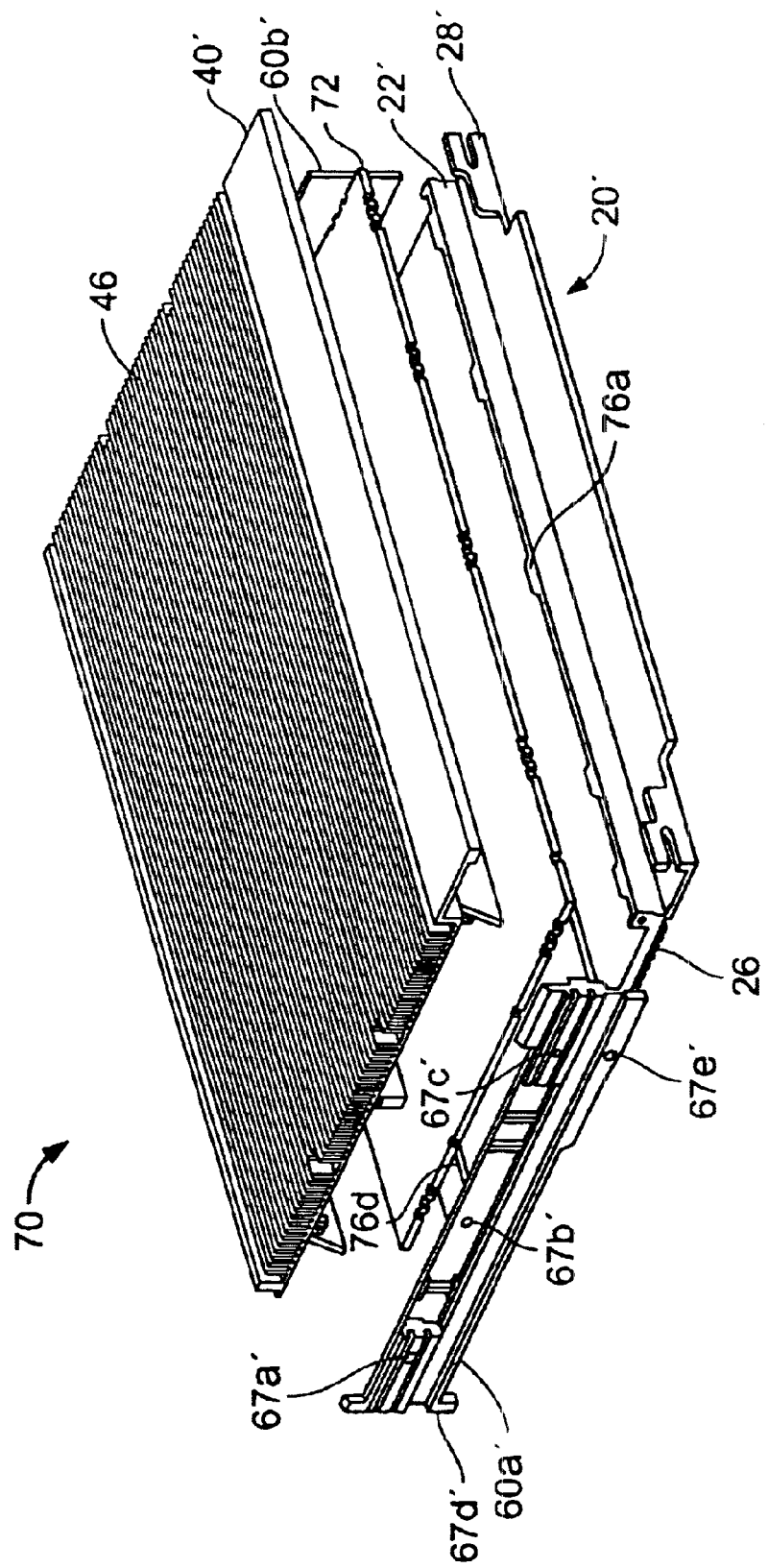
FIG. 6 is an exploded isometric plan view of an EMC electronic component enclosure formed from a top heatsink, a bottom heatsink, and a pair of side pieces.

FIG. 6 shows an exploded view of enclosure 70 formed from finished bottom heatsink 20', finished top heat sink 40', a pair of finished side members 60a' and 60b', and an electronic component board 72. The board 72 holds the electrical components. The finished side members 60a' and 60b' are created by machining parts similar to member 60. Clearance holes 67a'–67e' are drilled into the side member 60a'. These clearance holes align with the threaded holes 27a'–27b' and 47a'–47c' of the bottom and top heatsinks respectively (see FIG. 7). Top heatsink 40' is positioned onto the electronic component 72. Side members 60a' and 60b' are attached to the top and bottom heatsinks with screws via clearance holes 67a'–67e' which engage the tapped holes 27a'–27b' and 47a'–47c'. Furthermore the screws are passed through clearance holes 67a'–67e' and engage threads in holes 27a'–27b' and 47a'–47c'. In both of these instances where screws are used to connect parts, gaskets 76a–76h are formed to provide EM compatibility of the electronic component and the enclosure. These gaskets typically use "form in place" EMI gasketing technology. Suitable gasketing materials are Silver/Copper 5513 available from Chomerics, Woburn Mass. SNN45 M+ available from Laird, Delaware Water Gap, Pa. The applicators and dispensers for the gasketing materials are also available from the same suppliers. In order to ensure proper electrical contact between the parts and the gaskets, the parts are Class III clear chromate prior top application of the gasketing material. Class III MIL-C-5541 chemical conversion coating provides a barrier to corrosion while at the same time providing low electrical resistance required for EMC gaskets to operate effectively.

Figure 7:
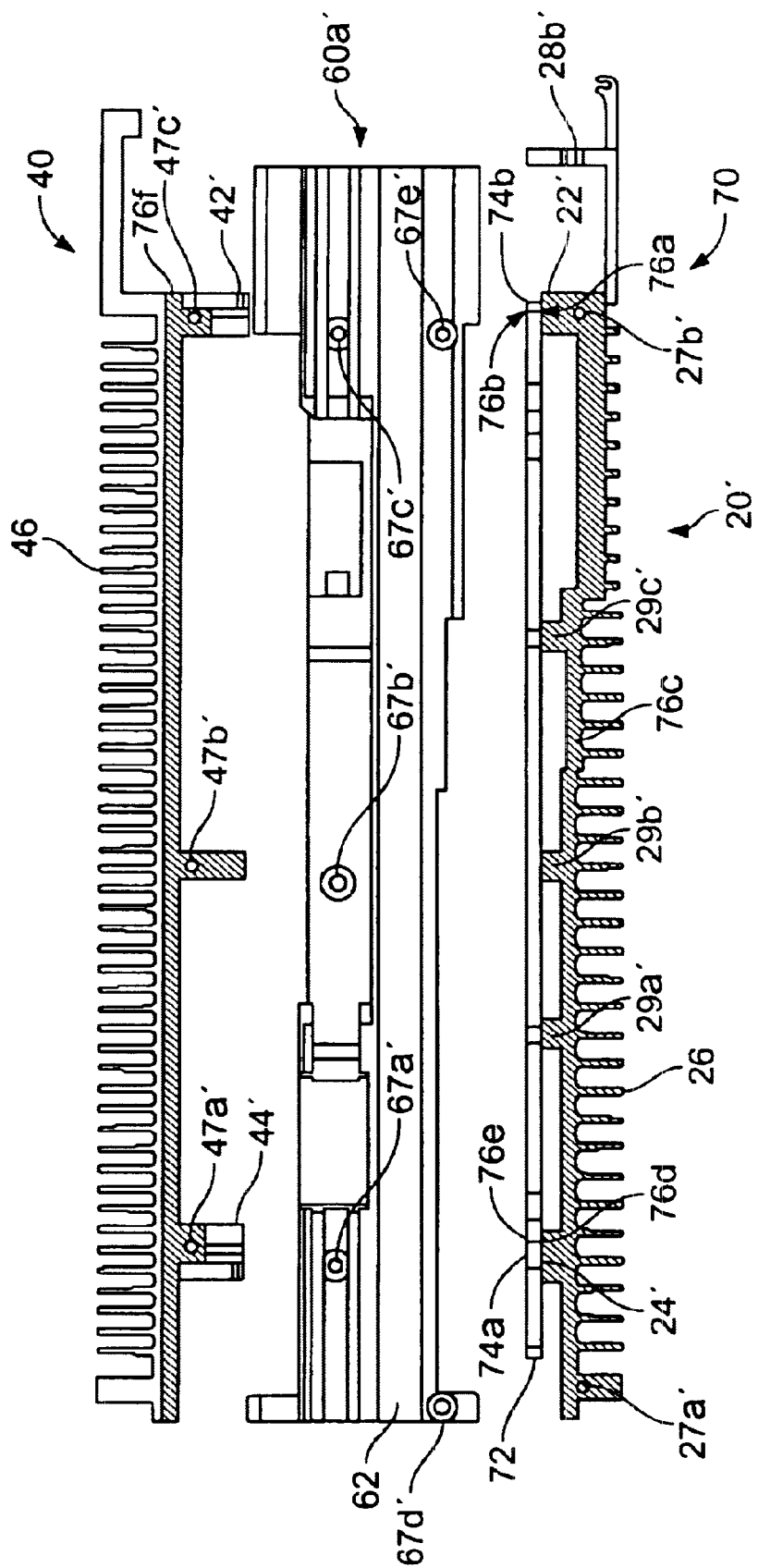
FIG. 7 is a side view of the EMC enclosure from FIG. 6.

FIG. 7 shows an exploded side view of enclosure 70. The electronic component board 72 includes conductive bands 74a and 74b which sit atop ribs 22' and 24' respectively of the bottom heatsink 20' forming a seal with the aid of gaskets 76a and 76d. Furthermore contact ribs 44' and 42' of the top heatsink 40' form a top seal to bands 74a and 74b with the aid of gasket 76b and 76c. Typically bands 74a–b are copper bands on the electronic component board 72. These structures form the front, back, top, and bottom of the sealing enclosure. With the aid of the gasket 76e–76h, side pieces 60' form the sides of the sealing enclosure. Referring to FIG. 7, conductive band 74b is continuous from top surface of board 72 over the edge of board 72 all the way to the bottom surface of 72. This band prevents emissions through any internal layers in the electronic component board. Conductive band 74a (near the backplane connector) may or may not have a continuous edge plating (from top to side to bottom) since a gasket on the backplane makes continuous contact with the rectangular box formed by top heatsink 20', bottom heatsink 40', and two side pieces 60a' and 60b' thus reducing emissions from the left (backplane connector side) side of this box.

Figure 8:
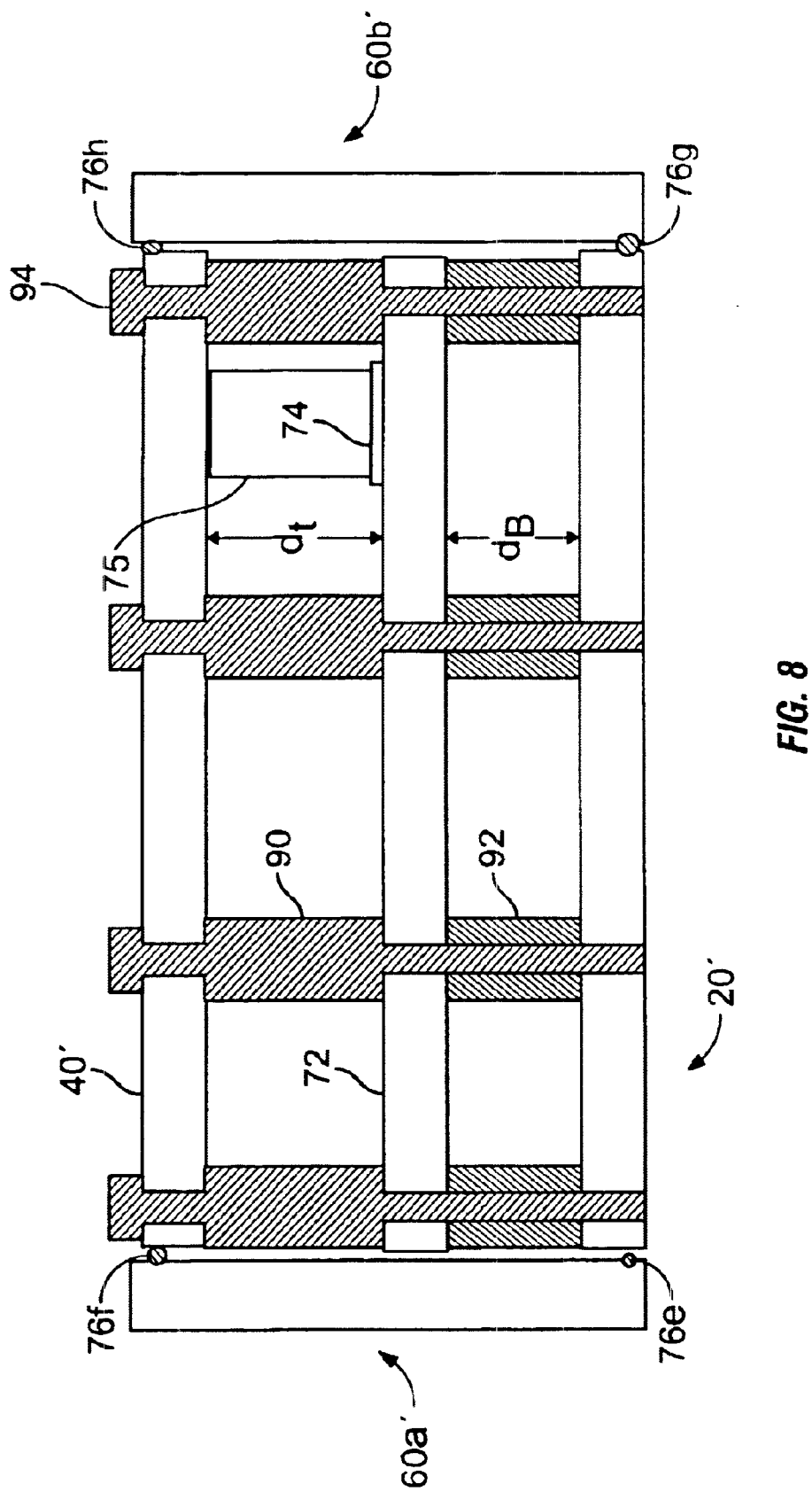
FIG. 8 is a cross sectional view of an EMC enclosure showing positioning pins.

In another embodiment, the enclosure enhances heat conduction from the electronic component board to the heat sink members 40' and 20' as shown in cross section in FIG. 8. In such embodiments, the enclosure 70 further includes top positioning pins, for example pin 90, bottom positioning pins, for example pin 92, and screws, for example screw 94. Such positioning pins control the distance and, from the electronic component board 72 and top and bottom heatsinks respectively. In addition to vertical positioning the pins provide horizontal positioning. For example, in FIG. 8 the pins control the positioning of the electronic board 72 with respect to side pieces 60a' and 60b' such that there is adequate clearance so that the board does not interfere with the fit of the side pieces 60a' and 60b' with heatsink 40' and 20'. The positioning pins themselves provide a thermal pathway between the board 72 and the top or bottom heatsinks. In addition, often electronic components or their corresponding electronic component boards are designed with a pad 74 and heat transfer structure 75. The heat transfer structure is specifically placed to remove heat from board 72. For example, it may be the heat transfer portion of an application specific integrated circuit (ASIC). Typically the height of such a structure is well known. Thus, positioning pins are designed to control distances such that after assembling the enclosure about the electronic board, the top of heat transfer structure 75 is close to the bottom of heatsink 40'. Typically an overfill compound is applied. Overfill is a two part paste composed of conductive particles suspended in a silicone type substrate. After mixing the 2 parts with a special syringe the overfill is injected through a hole (not shown) in the heatsink or conductive pedestal, which provides a access for the paste to flow through and spread over the heat transfer structure and thus voiding the gap between the heat transfer structure and heatsink surface of any air pockets. The overfill paste cures to a flexible solid in a matter of hours. Overfill can be purchased from Chomerics (T644 or T645), or Dow Corning in many different forms depending on the applications requirements. The overfill fills this small gap between the heat transfer structure and the heatsink 40' and provides a thermal bridge between the two parts. The overfill provides thermal contact between heat transfer structure 75 and the top heatsink 40'. Furthermore in some embodiments electronic board 72 is designed with backplane connectors that electrically connect the components of electronic board 72 with other electronic components. For example, the enclosure 70 is often placed into a chassis box. Guides 62 on the side pieces 60a' and 60b' guide the enclosure into the chassis box and the connectors on the backplane of the chassis box connect to the backplane connectors of the enclosure. The vertical position of the board 72 is determined by the height of pins 90 and 92 and thus these pins control the height of the backplane connectors of board 72, and therefore ensure proper alignment of the enclosures backplane connectors with the connectors on the chassis box backplane. In addition to providing positioning, these pins also provide mechanical stiffening to correct for any twist, bow, or warp that may be present in extruded parts.

Figure 9:
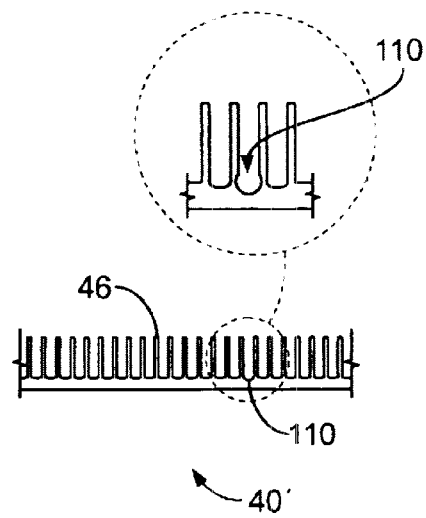
FIG. 9 is a cross sectional view of a heatsink member with a hole that is formed by the extrusion die.

In another embodiment, the drilled and tapped holes 27a'–27b' in the bottom heatsink, are formed directly by the extrusion process as shown in FIG. 9. FIG. 9 shows a side view cross section of part of the extruded top heatsink 40'. In addition to extruding the fins 46, the die is shaped to form cylindrical channels 110. Once formed, these channels are tapped at least along some portion. This additional feature in the extrusion process avoids the need to drill holes separately.

What is claimed is:

1. A method for producing an enclosed electronic component, the method comprising:
    extruding a first heatsink member having a plurality of cooling structures disposed on a first surface;
    extruding a second heatsink member having a plurality of cooling structures disposed on a first surface;
    disposing an electronic component on a second surface of one of the first and second heatsink members; and
    joining the first and second heatsink members, with a pair of joining members and conductive gasket material to form a sealed enclosure for the electronic component with the sealed enclosure providing electromagnetic isolation of the electronic component and a thermal pathway to remove heat from the electronic component;
    wherein extruding the first and second heatsink further comprises:
        forming first ribs on the second surfaces of the first and second heatsinks, with the electronic component having conductive bands on top and bottom surfaces thereof that are aligned with portions of the first ribs.

2. The method of claim 1 wherein joining further comprises:
    joining the top and bottom conductive bands of the electronic component to the first rib of the first and second heatsink members respectively.

3. The method of claim 2 wherein extruding the first and second heatsink further comprises:
    forming second ribs on the second surfaces of the first and second heatsinks with the electronic component having a second pair of conductive bands on top and bottom surfaces thereof that are aligned with portions of the second ribs and joining further comprises:
        joining the first and second top conductive bands of the electronic component to the first and second rib of the first heatsink member and joining the first and second bottom conductive bands of the electronic component to the first and second rib of the second heatsink member respectively.

4. The method of claim 1 further comprising
    forming positioning pins that align the first heatsink member, the second heatsink member, and the electronic component.

5. The method of claim 4 wherein a first portion of the positioning pins provide vertical positioning and a second portion provide horizontal positioning of the electronic component.

6. The method of claim 1 wherein joining comprises:
    securing contacting regions of the first and second heatsinks, the electronic component, and a pair of joining members with screws, and sealing regions about the contacting regions with the conductive gasket material.

7. The method of claim 6 wherein extruding of the top or bottom heatsink comprises
    forming a substantially cylindrical channel in the top or bottom heatsink wherein the diameter of the channel is suitable for forming threads that engage the screws.

8. The method of claim 1 wherein joining comprises welding contacting regions of the first heatsink, the second heatsink, the electronic component and the pair of joining members.

9. The method of claim 1 wherein joining comprises
    securing contacting regions between the first heatsink, the second heatsink, the electronic component and the pair of joining members by using a combination of screws and sealing regions about the contacting regions with the conductive gasket material for some of the contacting regions and welding for other contacting regions.

10. The method of claim 1 wherein the electronic component further comprises heat transfer structures that provide thermal coupling between the electronic component and the top or bottom heatsink.

11. A method for producing an enclosure for an electronic component, the method comprising:
    extruding a first heatsink member having a plurality of cooling structures disposed on a first surface;
    extruding a second heatsink member having a plurality of cooling structures disposed on a second surface;

joining the first and second heatsink members with a pair of joining members to form a sealed enclosure, the sealed enclosure providing electromagnetic isolation of the electronic component and a thermal pathway to remove heat from the electronic component;

wherein joining comprises securing contacting regions of the first and second heatsinks, and the pair of joining members with screws and sealing; regions about the contacting regions with conductive gasket material;

wherein extruding of the top or bottom heatsink comprises forming a substantially cylindrical channel in the top or bottom heatsink wherein the diameter of the channel is suitable for forming threads that engage the screws.

12. A method for producing an enclosure for an electronic component, the method comprising:

extruding a first heatsink member having a plurality of cooling structures disposed on a first surface;

extruding a second heatsink member having a plurality of cooling structures disposed on a second surface;

joining the first and second heatsink members with a pair of joining members to form a sealed enclosure, the sealed enclosure providing electromagnetic isolation of the electronic component and a thermal pathway to remove heat from the electronic component;

wherein joining comprise:
securing contacting regions of the first and second heatsink members, and the pair of joining members by using a combination of screws and sealing regions about the contacting regions with conductive gasket material for some contacting regions and welding the contacting regions for other contacting regions.

13. A packaged electronic component comprising:

an extruded first heatsink member having a plurality of cooling structures disposed on a first surface wherein the cooling structures have smooth surfaces characteristic of an extruded part;

an extruded second heatsink member having a plurality of cooling structures disposed on a first surface wherein the cooling structures have smooth surfaces characteristic of an extruded part;

an electronic component disposed within an enclosure provided by the first and second heatsink members, and a pair of joining members secured; and wherein the first and second heatsink, the joining members, and the electronic component are joined at contacting regions to form a sealed enclosure for the electronic component with the sealed enclosure providing electromagnetic isolation of the electronic component and a thermal pathway to remove heat from the electronic component;

wherein the first and second heatsink further comprise:
a first rib on the second surface of the first and second heatsinks and the electronic component board comprises
conductive bands on a top and a bottom surface of the electronic and wherein the top and bottom conductive bands of the electronic component board and the first ribs of the first and second heatsink members sealed with conductive gasket material.

14. The package of claim 13 wherein the first and second heatsink further comprise:
a second rib on the second surface of the first and second heatsinks and the electronic component board comprises
second conductive bands on the top and the bottom surface of the electronic board and the second ribs of the first and second heatsink members sealed with conductive gasket material.

15. The package of claim 13 further comprising
positioning pins that align the first heatsink member, the second heatsink member, and the electronic component board.

16. The package of claim 15 wherein the positioning pins provide either vertical or horizontal positioning of the electronic component board.

17. The package of claim 13 wherein the contacting regions comprise screws that secure the contacting regions of the first heatsink, the second heatsink, the electronic component board and the pair of joining members and regions of the conductive gasket material about the contacting regions.

18. The package of claim 17 wherein the top or bottom heatsink have a substantially cylindrical extruded channel in the top or bottom heatsink wherein the diameter of the channel is suitable for forming threads that engage the screws.

19. The package of claim 13 wherein the electronic component board further comprises heat transfer structures that provide thermal coupling between the electronic component and the top or bottom heatsink.

20. The package of claim 13 wherein the contacting regions comprise welds of the first heatsink, the second heatsink, the electronic component board and a the pair of joining members.

21. The package of claim 13 wherein the contacting regions of the first heatsink, the second heatsink, the electronic component board and the pair of joining members comprise a combination of screws and the conductive gaskets for some of the contacting regions and welds for other contacting regions.

* * * * *